US012288587B2

(12) United States Patent
Madison et al.

(10) Patent No.: US 12,288,587 B2
(45) Date of Patent: Apr. 29, 2025

(54) HIGH DYNAMIC RANGE TRACK AND HOLD AMPLIFIER OUTPUT STAGE USING LOW VOLTAGE DEVICES

(71) Applicant: BAE Systems Information and Electronic Systems Integration Inc., Nashua, NH (US)

(72) Inventors: Gary M. Madison, Waltham, MA (US); Kevin Grout, Manchester, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 103 days.

(21) Appl. No.: 18/477,058

(22) Filed: Sep. 28, 2023

(65) Prior Publication Data

US 2025/0111881 A1    Apr. 3, 2025

(51) Int. Cl.
| | |
|---|---|
| *G11C 27/02* | (2006.01) |
| *H03K 17/60* | (2006.01) |
| *H03K 17/687* | (2006.01) |
| *H03K 19/0175* | (2006.01) |

(52) U.S. Cl.
CPC ........... *G11C 27/026* (2013.01); *H03K 17/60* (2013.01); *H03K 17/687* (2013.01); *H03K 19/017509* (2013.01)

(58) Field of Classification Search
CPC ..... G11C 27/02; G11C 27/024; G11C 27/026; G11C 27/028; H03K 17/60; H03K 17/687; H03K 19/017509; H03K 19/017518; H03K 19/017527
USPC .............................................. 327/91, 94, 96
See application file for complete search history.

(56) References Cited

U.S. PATENT DOCUMENTS

| | | | |
|---|---|---|---|
| 4,645,951 A * | 2/1987 | Uragami | ................. H01L 24/49 |
| | | | 257/E27.11 |
| 6,121,794 A | 9/2000 | Kapoor | |
| 6,995,616 B2 | 2/2006 | Behzad et al. | |
| 7,564,298 B2 | 7/2009 | Mun et al. | |
| 8,541,787 B2 | 9/2013 | Zhang | |
| 8,854,138 B2 | 10/2014 | Lam | |

(Continued)

FOREIGN PATENT DOCUMENTS

| | | |
|---|---|---|
| WO | 200139366 | 5/2001 |
| WO | 2018182709 | 10/2018 |
| WO | 2021226495 | 11/2021 |

OTHER PUBLICATIONS

Bouvier, Y., Ouslimani, A., Konczykowska, A. and Godin, J., 2009. A 1 GSample/s, 15 GHz Input Bandwidth Master-Slave Track and Hold Amplifier in InP DHBT Technology. IEEE Transactions on Microwave Theory and Techniques, 57(12), pp. 3181 3187.

(Continued)

*Primary Examiner* — William Hernandez
(74) *Attorney, Agent, or Firm* — Sand, Sebolt & Wernow LPA (57) ABSTRACT

A sample and hold amplifier output buffer with the low leakage of metal oxide semiconductor field effect transistors (MOSFET) combined with the linearity and dynamic range of silicon-germanium (SiGe) bipolar junction transistors (BJT). In one aspect, the present disclosure provides a sample and hold amplifier output buffer placing a MOSFET input device between the base and emitter of a high linearity SiGe BJT.

20 Claims, 2 Drawing Sheets

(56) References Cited

U.S. PATENT DOCUMENTS

| | | |
|---|---|---|
| 9,054,695 B2 | 6/2015 | Dasgupta et al. |
| 10,429,879 B1 | 10/2019 | Coimbra |
| 10,469,035 B2 | 11/2019 | Zheng et al. |
| 10,804,887 B1 | 10/2020 | Prasad |
| 10,931,280 B2 | 2/2021 | Ramalingam et al. |
| 11,393,811 B2 | 7/2022 | Blair |
| 2006/0028260 A1 | 2/2006 | Baumgartner |
| 2006/0145729 A1 | 7/2006 | Luh |
| 2008/0106304 A1 | 5/2008 | Mun et al. |
| 2011/0050287 A1 | 3/2011 | Glass |
| 2013/0321059 A1* | 12/2013 | Allen ............ H03K 19/018521 327/333 |
| 2017/0110450 A1 | 4/2017 | Ning et al. |

OTHER PUBLICATIONS

Y. Bouvier, A. Konczykowska, A. Ouslimani, F. Jorge, M. Riet, and J. Godin, "A 20 GSAMPLES/s track hold amplifier in Inp Dhbt technology," 2007 European Microwave Integrated Circuit Conference, 2007.

Y. Bouvier, A. Ouslimani, A. Konczykowska, and J. Godin, "A 40 gsamples/s INP DHBT track and hold amplifier with high dynamic range and large bandwidth," 2012 8th International Symposium on Communication Systems, Networks & Digital Signal Processing (CSNDSP), 2012.

J. Deza, A. Ouslimani, A. Konczykowska, A. Kasbari, and J. Godin, "A 4 GSA/s, 16 GHz input bandwidth master slave track and hold amplifier in INP DHBT technology," 2012 20th Telecommunications Forum (TELFOR), 2012.

H. Aggrawal and A. Babakhani, "A 40gs/s track and hold amplifier with 62db SFDR3 in 45NM CMOS SOI," 2014 IEEE MTT S International Microwave Symposium (IMS2014), 2014.

Shunli Ma, Jiacheng Wang, H. Yu, and Junyan Ren, "A 32.5 GS/s two channel time interleaved CMOS sampler with switched source follower based track and hold amplifier," 2014 IEEE MTT S International Microwave Symposium (IMS2014), 2014.

A. M. Ali, H. Dinc, P. Bhoraskar, S. Bardsley, C. Dillon, M. McShea, J. P. Periathambi, and S. Puckett, "A 12 B 18 GS/s RF sampling ADC with an integrated wideband track and hold amplifier and background calibration," IEEE Journal of Solid State Circuits, vol. 55, No. 12, pp. 3210-3224, 2020.

S. Daneshgar, Z. Griffith, M. Seo, and M. J. Rodwell, "Low distortion 50 gsamples/s track hold and sample hold amplifiers," IEEE Journal of Solid State Circuits, vol. 49, No. 10, pp. 2114-2126, 2014.

* cited by examiner

HIGH DYNAMIC RANGE TRACK AND HOLD AMPLIFIER OUTPUT STAGE USING LOW VOLTAGE DEVICES

STATEMENT OF GOVERNMENT INTEREST

This invention was made with government support under FA8650 19 C 7935 awarded by DARPA. The government has certain rights in the invention.

TECHNICAL FIELD

The present disclosure relates generally to track and hold amplifier circuits. More particularly, in one example, the present disclosure relates to sample and hold amplifier output buffers with low leakage and high dynamic range. Specifically, in another example, the present disclosure relates to a combination sample and hold amplifier output buffer providing the low leakage benefits of metal oxide semiconductor field event transistors with the dynamic range of bipolar junction transistors.

BACKGROUND ART

Sample and hold circuits are common circuits used to sample an input voltage at a specific time and hold that sampled voltage on a capacitor. One common type of sample and hold circuit may utilize a fast switch to store the input signal voltage on a capacitor. Commonly, sample and hold circuits are ubiquitous with many applications and are particularly common in analog to digital converters. In many cases, sample and hold circuits require sense amplifiers with high input impedance on the capacitors. This is to allow readout of the voltage stored on the capacitor without corrupting the stored value. The output of such sense amplifiers may connect directly to conversion circuitry (single rank configuration) or to additional sample and hold circuits (multi-rank configuration). Because the sense amplifiers must be high impedance, they generally cannot use bipolar junction devices at the amplifier input, because bipolar junction devices generally have low input impedance and high input current.

Additionally, the amplifiers sensing the voltage on the sampling capacitor typically requires a combination of high speed, wide dynamic range, and extremely low leakage, which is difficult to obtain in current systems. Specifically, most high performance sample and hold circuits rely on non-silicon based devices to enable higher frequencies. One such example includes silicon-germanium (SiGe) bipolar junction transistors (BJT) processes, which can provide high frequency and wide dynamic range with the tradeoff of large base current leakage. Alternatively, high speed metal oxide semiconductor field effect transistors (MOSFET) reduce or eliminate the leakage issues experienced with BJTs; however, at the expense of low linearity and voltage tolerance. Specifically, the highest speed MOSFETs have small geometry with minimal gate lengths and suffer from low voltage ratings and low resistance difference between the drain and source on the circuit. This may cause the drain current to vary with drain voltage, which may further cause significant distortion even in common source follower applications. Further, it is difficult to maintain linearity with large voltage inputs as the high voltages required therefor cannot normally be tolerated by the low voltage MOSFET devices.

Other current methods to improve track and hold circuits and track and hold amplifiers simply rely on extremely tight calibration specifications, which raise computational complexity significantly and can further result in increased maintenance costs as the calibration may need to be performed on a more regular basis to maintain the tight specifications used therewith.

Current systems, including analog to digital converters utilizing current sample and hold circuits, therefor suffer from high leakage and/or narrow frequency dynamic range, or alternatively, require increased computational complexity and implementation and maintenance costs.

SUMMARY OF THE INVENTION

The present disclosure addresses these and other issues by providing a sample and hold amplifier output buffer with the low leakage of metal oxide semiconductor field effect transistors (MOSFET) combined with the linearity and dynamic range of silicon-germanium (SiGe) bipolar junction transistors (BJT). In one aspect, the present disclosure provides a sample and hold amplifier output buffer placing a MOSFET input device between the base and emitter of a high linearity SiGe BJT.

In one aspect, an exemplary embodiment of the present disclosure may provide a sample and hold amplifier buffer comprising: a positive input; a negative input; an output; at least one negative-positive-negative (NPN) bipolar junction transistor (BJT); at least one load device; and at least one metal oxide semiconductor field transistor (MOSFET) between a base and an emitter of the NPN BJT. This exemplary embodiment or another exemplary embodiment may further provide at least one NPN current source. This exemplary embodiment or another exemplary embodiment may further provide wherein the at least one NPN BJT further comprises: at least one silicon germanium transistor. This exemplary embodiment or another exemplary embodiment may further provide wherein the at least one MOSFET further comprises: at least one positive-channel MOSFET. This exemplary embodiment or another exemplary embodiment may further provide wherein the at least one load device further comprises: at least one of a load impedance resistor and a feedback impedance resistor. This exemplary embodiment or another exemplary embodiment may further provide at least two NPN BJTs; at least two load devices; and at least two MOSFETs between the base and the emitter of the NPN BJTs; wherein the buffer is symmetrical.

In another aspect, an exemplary embodiment of the present disclosure may provide a sample and hold amplifier buffer comprising: a positive input; a negative input; an output; at least one level shifter; at least one negative-positive-negative (NPN) bipolar junction transistor (BJT); at least one load device; and at least one metal oxide semiconductor field transistor (MOSFET) between a base and an emitter of the NPN BJT. This exemplary embodiment or another exemplary embodiment may further provide wherein the at least one NPN BJT further comprises: at least one silicon germanium transistor. This exemplary embodiment or another exemplary embodiment may further provide wherein the at least one MOSFET further comprises: at least one positive-channel MOSFET. This exemplary embodiment or another exemplary embodiment may further provide wherein the at least one level shifter further comprises: at least one negative-channel MOSFET. This exemplary embodiment or another exemplary embodiment may further provide wherein the at least one level shifter further comprises: at least one of a unidirectional logic level shifter and a unidirectional voltage level translator. This exemplary embodiment or another exemplary embodiment may further provide wherein the at least one level shifter further comprises: at least one of a bidirectional logic level shifter and a bidirectional voltage level translator. This exemplary embodiment or another exemplary embodiment may further provide wherein the at least one load device further comprises: at least one of a load impedance resistor and a feedback impedance resistor. This exemplary embodiment or another exemplary embodiment may further provide at least two level shifters; at least two NPN BJTs; at least two load devices; and at least two MOSFETs between the base and the emitter of the NPN BJTs; wherein the buffer is symmetrical.

In yet another aspect, an exemplary embodiment of the present disclosure may provide a sample and hold system comprising: at least one input; a first buffer circuit; a fast sampling switch; a second buffer circuit; and an output; wherein the first buffer circuit and the second buffer circuit both further comprise: at least one negative-positive-negative (NPN) bipolar junction transistor (BJT); and at least one metal oxide semiconductor field transistor (MOSFET) between a base and an emitter of the NPN BJT. This exemplary embodiment or another exemplary embodiment may further provide wherein the at least one NPN BJT of the first buffer circuit and the at least one NPN BJT of the second buffer circuit both further comprise: at least one silicon germanium transistor. This exemplary embodiment or another exemplary embodiment may further provide wherein the first buffer circuit and the second buffer circuit both further comprise: at least one of a load impedance resistor and a feedback impedance resistor. This exemplary embodiment or another exemplary embodiment may further provide wherein the at least one MOSFET of the first buffer circuit and the second buffer circuit both further comprise: at least one positive-channel MOSFET. This exemplary embodiment or another exemplary embodiment may further provide wherein the first buffer circuit and the second buffer circuit both further comprise: at least one logic level shifter. This exemplary embodiment or another exemplary embodiment may further provide wherein the at least one logic level shifter further comprises: at least one negative-channel MOSFET.

BRIEF DESCRIPTION OF THE DRAWINGS

Sample embodiments of the present disclosure are set forth in the following description, are shown in the drawings and are particularly and distinctly pointed out and set forth in the appended claims.

Similar numbers refer to similar parts throughout the drawings.

DETAILED DESCRIPTION

With general reference to FIGS. 1 and 2, an exemplary first buffer circuit 10 and second buffer circuit 26 are shown and will be described generally. In particular, first buffer 10 is shown and described with reference to FIG. 1 while second buffer 26 is shown and described with reference to FIG. 2. Both first and second buffers 10 and 26 may be somewhat similar in that they may have similar architecture and components; however, each buffer 10, 26 will be described both generally and in more detail herein.

Figure 1:
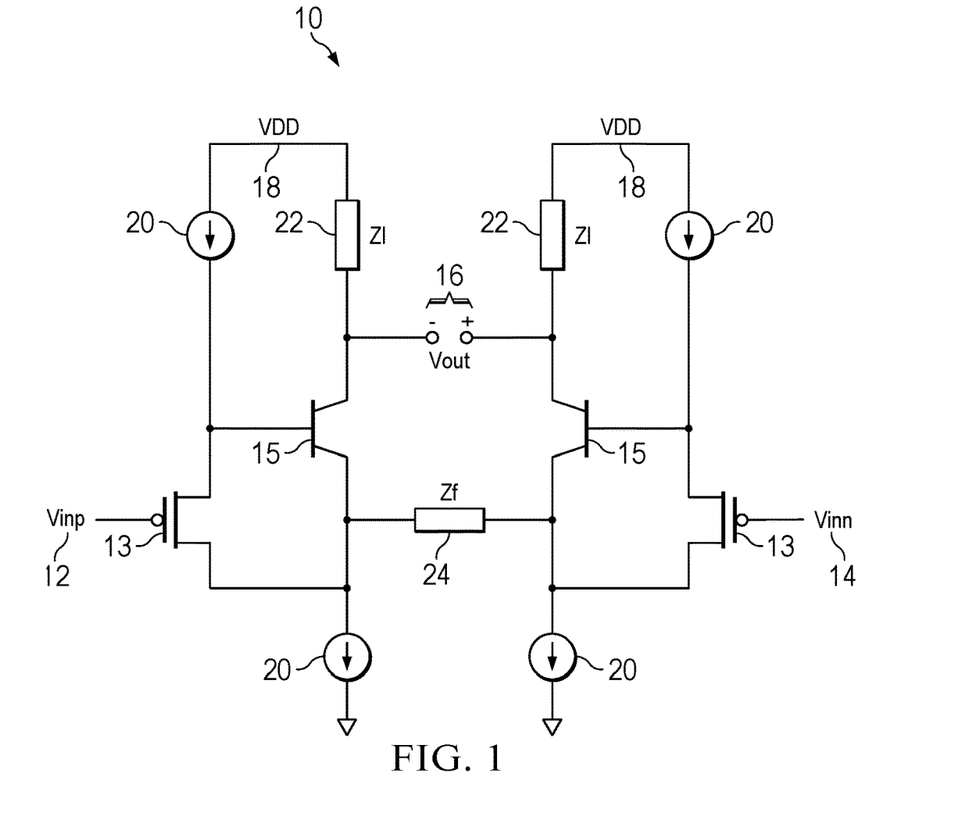
FIG. 1 is an exemplary circuit diagram of an exemplary first buffer according to one aspect of the present disclosure.

With reference then to FIG. 1, first buffer circuit 10 (also referred to herein simply as first buffer 10) will now be described. First buffer 10 may include a positive voltage input (Vinp) 12 and a negative voltage input (Vinn) 14. First buffer may further include at least one metal oxide semiconductor field transistor (MOSFET) 13 which may be a positive-channel MOSFET 13, or PMOS, and at least one bipolar junction transistor (BJT) 15. First buffer 10 may further include an output shown as Vout 16, one or more VDDs 18, at least one negative-positive-negative (NPN) current source 20, at least one load impedance resistor 22, and at least one feedback impedance resistor 24.

At its most basic, first buffer 10 may provide MOSFET 13 between the base and emitter of a high-linearity silicon germanium (SiGe) BJT 15. The MOSFET 13 source connected to the BJT 15 base may further include a MOSFET 13 source connected to a BJT 15 emitter with the MOSFET 13 being a positive-channel MOSFET and the BJT 15 being NPN. This may allow low leakage associated with the MOSFET 13 gate with a unity gain frequency response but high-linearity and high breakdown voltage associated with the BJT 15 base and emitter.

Figure 2:
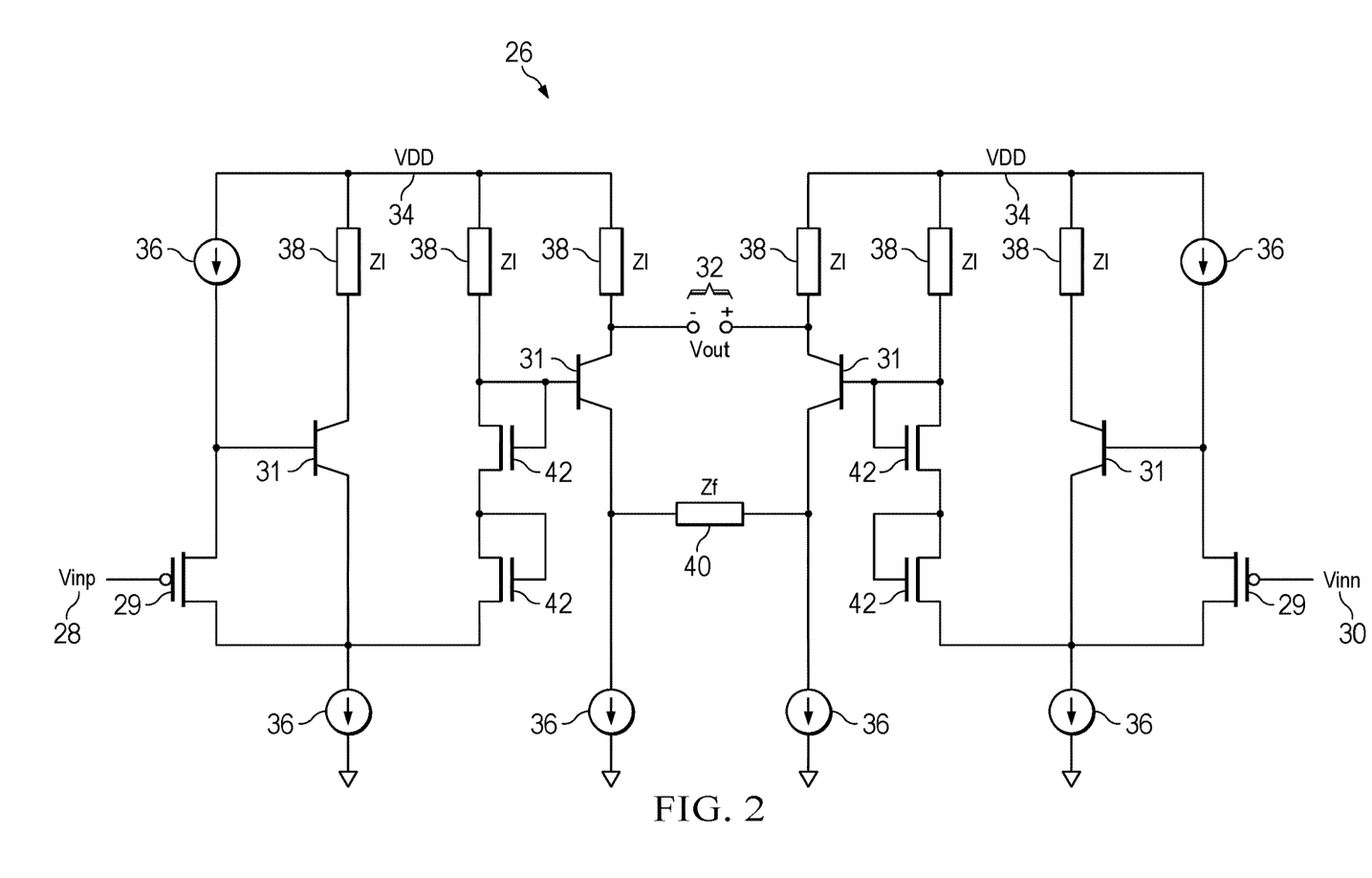
FIG. 2 is an exemplary circuit diagram of an exemplary first buffer according to one aspect of the present disclosure.

With reference to FIG. 2 second buffer circuit 26 (also referred to herein as simply second buffer 26) is shown and will be described. As with first buffer 10, second buffer 26 may include a positive input Vinp 28, a negative input Vinn 30, at least one MOSFET 29, which may again be a PMOS, at least one bipolar junction transistor (BJT) 31, an output Vout 32, one or more VDDs 34, at least one current source 36, at least one load impedance resistor 38, and at least one feedback impedance resistor 40. Second buffer 26 may differ from first buffer 10 in that it may include one or more level shifters 42 utilizing diode connected devices to linearly shift the level of the buffer 26. According to one aspect, level shifters 42 may be negative-channel MOSFETs 42 (NMOS), or other suitable devices.

Second buffer 26 may further be understood as a second embodiment of a buffer that may be utilized interchangeable with first buffer 10 according to the desired implementation thereof, as discussed further herein.

With continued reference to FIGS. 1 and 2, and as discussed above, in both first and second buffers 10 and 26, all inputs 12, 14, 28, and or 30, may be any suitable input or input device operable to generate or provide a voltage into the buffers 10, 26, as dictated by the desired implementation, with inputs 12 and 28 serving as positive voltage inputs and inputs 14 and 30 serving as negative voltage inputs. These inputs may be directly connected to the voltage source or may be connected through other components as dictated by the desired implementation. According to one aspect, the inputs Vinp 12 and 28 and Vinn 14 and 30 may be further connected to an emitter, transmitter, transceiver, or other similar device.

Both of first and second buffers 10 and 26 may be symmetrical, having two of each relevant component, as illustrated in FIGS. 1 and 2. For example, as shown, first buffer 10 may have two MOSFETS 13, two BJTs 15, two VDDs 18, two current sources 20, and two load impedance resistors 22. In such symmetrical arrangement, first buffer 10 may still share an output 16 and a feedback impedance resistor 24. Second buffer 26 may similarly include a matched or symmetrical arrangement.

According to another aspect, first and/or second buffers 10 and/or 26 may be single-ended (i.e. assymetrical) having only one occurrence of some or all components therein; as dictated by the desired implementation and use thereof. Further according to this aspect, first and/or second buffers 10 and/or 26 may be modified to include feedback resistors 24/40 to connect one lead of the resistor to an alternate portion of the circuit, as needed.

Outputs 16 and 32 of first buffer 10 and second buffer 26, respectively, may be directly connected to a fast switch sample and hold circuit (shown in FIG. 3 as sampling switch 48, discussed further below) or any other suitable output device as dictated by the desired implementation.

VDDs 18 and/or 34 of first and/or second buffers 10, 26 may be any suitable voltage supply from which the circuit may draw power, as dictated by the desired implementation.

Current sources 20 and 36 may be any suitable or standard current source. According to one aspect, current sources 20 and 36 may be transistors, such as bipolar transistors having an NPN configuration. According to another aspect, current sources 20 and 36 may be any suitable NPN transistor for use as a bipolar junction transistor. As discussed herein the current sources 20 and 36 may be BJT NPN transistors which may provide high-frequency wide dynamic range while the MOSFET inputs may offset the leakage of the BJT NPN transistors.

According to one aspect, where current sources 20 and 36 are transistors, they may be formed of silicon germanium (SiGe) or any other suitable material, and may be manufactured through any suitable means, including, but not limited to, additive manufacturing.

Both load impedance resistors 22 and 38 and feedback impedance resistors 24 and 40 may be any suitable resistor type and/or complex impedance type device configuration operable for use in use in sample and hold circuits, such as the ones described herein. These load devices may be constructed using any suitable construction method and or process and may be used to store or hold voltage, as described further herein.

With continued reference to FIG. 2, and as mentioned above, second buffer 26 may further include one or more level shifters 42 which may be standard level shifters including, NMOS, unidirectional or bi-directional logic level shifters or voltage level translators operable to translate signals between logic levels and/or voltage domains as dictated by the desired implementation. These level shifters may provide additional compatibility between the MOSFETs 13, 29 and BJTs 15, 31, as discussed further herein.

As mentioned above, both first and second buffers 10 and 26 may be interchangeable and/or compatible in that they may be used in place of and/or in conjunction with each other. Further, both first and second buffers 10 and 26 may be configured for use along with other buffers or components as desired or as dictated by the desired implementation. According to one aspect, first and/or second buffers 10 and/or 26 may be used in legacy sample and hold amplifier systems or may be incorporated into novel systems, as desired.

Figure 3:
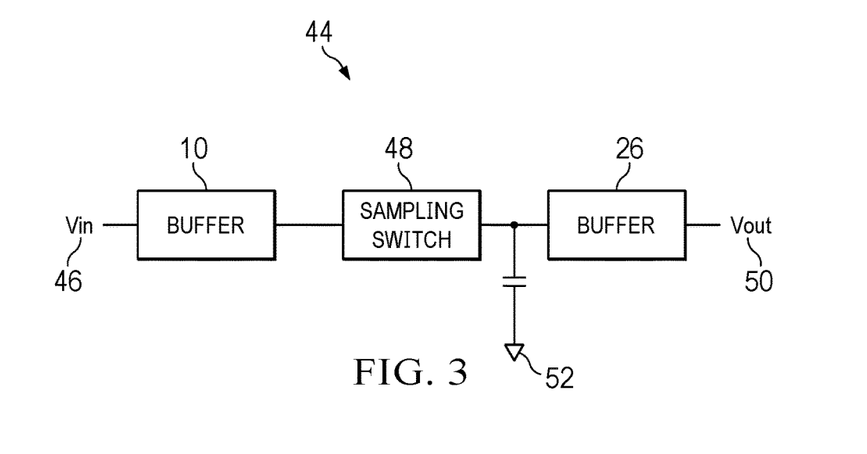
FIG. 3 is an exemplary schematic block diagram of a system architecture incorporating the first and/or second buffer circuits from FIGS. 1 and/or 2 according to one aspect of the present disclosure.

With reference to FIG. 3, an exemplary sample and hold system architecture is shown and referenced at 44. According to the example shown, system architecture 44 may include an input device 46, a sampling switch 48, and an output device 50. Between input 46 and sampling switch 48 may be one of first buffer 10 or second buffer 26 depending on the desired implementation. This exemplary system architecture 44 may further include a second instance of either first buffer 10 or second buffer 26 between the sampling switch 48 and output 50. The architecture 44 may further include one or more ground or ground circuits 52, which may be any suitable low voltage level into which all current from the VDDs 18 and 34 may flow.

Sampling switch 48 may be any suitable or standard sample and hold switch or switch type, such as those used in analog to digital converters. Switch 48 may further be or include a fast switch, as dictated by the desired implementation.

Input 46 and output 50 may any suitable devices or systems as dictated by the desired implementation. According to one aspect, input may be a transmitter or emitter while output may be an antenna array or the like. According to another aspect, input may be a receiver or receiver array while output may be a processor or the like. According to another aspect, input may be any suitable input device or detector capable of capturing some data which may be sampled and held by the sampling switch 48. According to some non-limiting and non-exhaustive examples, input data may include temperature, light intensity, air speed, ground speed, direction, velocity, angle, elevation, azimuth, volume, wavelength, or any other suitable data.

It will therefore be understood that the inclusion of buffers 10 and/or 26 in sample and hold circuits, or more particularly, the use of a low voltage positive MOSFET 13, 29 between an emitter and base of a robust NPN BJT 15, 31 may be suitable for use with any typical data and/or data detector normally used in sample and hold environments and applications.

Having thus described the elements and components of first and second buffers 10 and 26 and the system architecture 44 of an exemplary system employing the same, the operation and benefits thereof will now be discussed in more detail.

At its most basic, both first buffer 10 and second buffer 26 may provide a fast minimum gate length low voltage MOSFET 13, 29 between the emitter and base of a NPN BJT 15, 31 to realize the benefits of both the MOSFET 13, 29 and the BJT 15, 31 while minimizing and/or eliminating the undesired effects of using either a MOSFET 13, 29 or BJT 15, 31 output buffer alone. In particular, the inclusion of a thin oxide low voltage MOSFET buffer such as first buffer 10 and/or second buffer 26 between the base and emitter of a high linearity SiGe BJT may provide for low leakage associated with the MOSFET input device while providing high linearity and high breakdown voltage associated with a bipolar BJT transistor.

As shown in Table 1 below a comparison of performance attributes between the presently disclosed first and second buffers 10 and 26 and other prior art sample and hold amplifiers is shown. These prior art sample and hold amplifiers may include both proposed devices and/or commercial off the shelf (COTS) amplifiers that are readily available on the market. These amplifiers are indicated generically as amplifiers 1 through 9 in Table 1, while the presently disclosed buffers 10 and 26 are indicated in the final column titled "This Work."

The performance attributes provided will be understood as illustrative as each parameter may be affected by the installation and/or operating conditions; however, as seen in Table 1, both first and second buffers 10 and 26, when operated normally with the inclusion of a fast, minimum gate length, low-voltage MOSFET between the emitter and base of a robust and high linearity NPN BJT, offer improved performance across most tested parameters as compared to the proposed and/or COTS amplifiers.

TABLE 1

| Spec | 1 | 2 | 3 | 4 | 5 | 6 | 7 | 8 | 9 | This Work |
|---|---|---|---|---|---|---|---|---|---|---|
| BW | 15G | 20 | 10 | 27 | 16 | NR | 19 | 18 | 18 | >50 |
| Fsamp | 1G | 20 | 20 | 40 | 4 | 40G | 16 | 10 | 50 | >8 |
| Linearity | 39 | 21.9 | 18 | 42 | 23 | N/A | 37 | N/A | 31 | 35 |
| Process | InP | InP | InP | InP | InP | 45SOI | 65 nm | 16 nm (finfet) | InP | 45SOI |
| Range | 1 vpp | 0.5 vpp | 0.5 vpp | 0.5 vpp | 1.3 vpp | 0.25 | NR | ~1 | 1.8 vpp | 1.2 vpp |
| ENOB (noise) | NR | 10.5 | NR | NR | NR | NR | NR | 8.8 | NR | ~10 |
| Power | 5.2 W | NR | 0.74 W | 1.9 W | 2.1 W | 0.42 W | 0.19 W | N/A | 2.1 W | 0.4 W |
| Area | 4.5 mm2 | 2.2 mm2 | 4 mm2 | NR | NR | 0.32 | 0.36 | N/A | 1 mm | 0.05* |
| Input Impedance | Low | Low | Low | Low | Low | High | High | High | Low | High |

Specifically, as shown in Table 1, the first and/or second buffers 10 and 26 provide increased bandwidth performance of greater than 50 GHz while maintaining or improving performance in linearity process, range, noise, power and input impedance as compared to the illustrated prior art devices 1 through 9.

In operation, the topology of the output amplifier for use in association with sample and hold switches again allows for the low-voltage, low leakage input of a MOSFET with the high speed and wide dynamic range of BJT devices.

Operation of the buffers 10 and/or 26 may be performed normally in that the operation may be substantially identical to the normal operation of existing sample and hold amplifier buffers; however, it is the inclusion of the present buffers 10 and 26 that may provide the increased performance benefits of the sample and hold systems.

The device, assembly, or system of the present disclosure may additionally include one or more sensor to sense or gather data pertaining to the surrounding environment or operation of the device, assembly, or system. Some exemplary sensors capable of being electronically coupled with the device, assembly, or system of the present disclosure (either directly connected to the device, assembly, or system of the present disclosure or remotely connected thereto) may include but are not limited to: accelerometers sensing accelerations experienced during rotation, translation, velocity/speed, location traveled, elevation gained; gyroscopes sensing movements during angular orientation and/or rotation, and rotation; altimeters sensing barometric pressure, altitude change, terrain climbed, local pressure changes, submersion in liquid; impellers measuring the amount of fluid passing thereby; Global Positioning sensors sensing location, elevation, distance traveled, velocity/speed; audio sensors sensing local environmental sound levels, or voice detection; Photo/Light sensors sensing ambient light intensity, ambient, Day/night, UV exposure; TV/IR sensors sensing light wavelength; Temperature sensors sensing machine or motor temperature, ambient air temperature, and environmental temperature; and Moisture Sensors sensing surrounding moisture levels.

The device, assembly, or system of the present disclosure may include wireless communication logic coupled to sensors on the device, assembly, or system. The sensors gather data and provide the data to the wireless communication logic. Then, the wireless communication logic may transmit the data gathered from the sensors to a remote device. Thus, the wireless communication logic may be part of a broader communication system, in which one or several devices, assemblies, or systems of the present disclosure may be networked together to report alerts and, more generally, to be accessed and controlled remotely. Depending on the types of transceivers installed in the device, assembly, or system of the present disclosure, the system may use a variety of protocols (e.g., Wifi, ZigBee, MiWi, Bluetooth) for communication. In one example, each of the devices, assemblies, or systems of the present disclosure may have its own IP address and may communicate directly with a router or gateway. This would typically be the case if the communication protocol is WiFi.

In another example, a point-to-point communication protocol like MiWi or ZigBee is used. One or more of the device, assembly, or system of the present disclosure may serve as a repeater, or the devices, assemblies, or systems of the present disclosure may be connected together in a mesh network to relay signals from one device, assembly, or system to the next. However, the individual device, assembly, or system in this scheme typically would not have IP addresses of their own. Instead, one or more of the devices, assemblies, or system of the present disclosure communicates with a repeater that does have an IP address, or another type of address, identifier, or credential needed to communicate with an outside network. The repeater communicates with the router or gateway.

In either communication scheme, the router or gateway communicates with a communication network, such as the Internet, although in some embodiments, the communication network may be a private network that uses transmission control protocol/internet protocol (TCP/IP) and other common Internet protocols but does not interface with the broader Internet, or does so only selectively through a firewall.

The system that receives and processes signals from the device, assembly, or system of the present disclosure may differ from embodiment to embodiment. In one embodiment, alerts and signals from the device, assembly, or system of the present disclosure are sent through an e-mail or simple message service (SMS; text message) gateway so that they can be sent as e-mails or SMS text messages to a remote device, such as a smartphone, laptop, or tablet computer, monitored by a responsible individual, group of individuals, or department, such as a maintenance department. Thus, if a particular device, assembly, or system of the present disclosure creates an alert because of a data point gathered by one or more sensors, that alert can be sent, in e-mail or SMS form, directly to the individual responsible for fixing it. Of course, e-mail and SMS are only two examples of communication methods that may be used; in other embodiments, different forms of communication may be used.

In other embodiments, alerts and other data from the sensors on the device, assembly, or system of the present disclosure may also be sent to a work tracking system that allows the individual, or the organization for which he or she works, to track the status of the various alerts that are received, to schedule particular workers to repair a particular device, assembly, or system of the present disclosure, and to track the status of those repair jobs. A work tracking system would typically be a server, such as a Web server, which provides an interface individuals and organizations can use, typically through the communication network. In addition to its work tracking functions, the work tracker may allow broader data logging and analysis functions. For example, operational data may be calculated from the data collected by the sensors on the device, assembly, or system of the present disclosure, and the system may be able to provide aggregate machine operational data for a device, assembly, or system of the present disclosure or group of devices, assemblies, or systems of the present disclosure.

The system also allows individuals to access the device, assembly, or system of the present disclosure for configuration and diagnostic purposes. In that case, the individual processors or microcontrollers of the device, assembly, or system of the present disclosure may be configured to act as Web servers that use a protocol like hypertext transfer protocol (HTTP) to provide an online interface that can be used to configure the device, assembly, or system. In some embodiments, the systems may be used to configure several devices, assemblies, or systems of the present disclosure at once. For example, if several devices, assemblies, or systems are of the same model and are in similar locations in the same location, it may not be necessary to configure the devices, assemblies, or systems individually. Instead, an individual may provide configuration information, including baseline operational parameters, for several devices, assemblies, or systems at once.

As described herein, aspects of the present disclosure may include one or more electrical, pneumatic, hydraulic, or other similar secondary components and/or systems therein. The present disclosure is therefore contemplated and will be understood to include any necessary operational components thereof. For example, electrical components will be understood to include any suitable and necessary wiring, fuses, or the like for normal operation thereof. Similarly, any pneumatic systems provided may include any secondary or peripheral components such as air hoses, compressors, valves, meters, or the like. It will be further understood that any connections between various components not explicitly described herein may be made through any suitable means including mechanical fasteners, or more permanent attachment means, such as welding or the like. Alternatively, where feasible and/or desirable, various components of the present disclosure may be integrally formed as a single unit.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of technology disclosed herein may be implemented using hardware, software, or a combination thereof. When implemented in software, the software code or instructions can be executed on any suitable processor or collection of processors, whether provided in a single computer or distributed among multiple computers. Furthermore, the instructions or software code can be stored in at least one non-transitory computer readable storage medium.

Also, a computer or smartphone may be utilized to execute the software code or instructions via its processors may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers or smartphones may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software/instructions that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, USB flash drives, SD cards, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the disclosure discussed above. The computer readable medium or media can be transportable, such that the program or programs stored thereon can be loaded onto one or more different computers or other processors to implement various aspects of the present disclosure as discussed above.

The terms "program" or "software" or "instructions" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments. As such, one aspect or embodiment of the present disclosure may be a computer program product including least one non-transitory computer readable storage medium in operative communication with a processor, the storage medium having instructions stored thereon that, when executed by the processor, implement a method or process described herein, wherein the instructions comprise the steps to perform the method(s) or process(es) detailed herein.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

All definitions, as defined and used herein, should be understood to control over dictionary definitions, definitions in documents incorporated by reference, and/or ordinary meanings of the defined terms.

"Logic", as used herein, includes but is not limited to hardware, firmware, software, and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

Furthermore, the logic(s) presented herein for accomplishing various methods of this system may be directed towards improvements in existing computer-centric or internet-centric technology that may not have previous analog versions. The logic(s) may provide specific functionality directly related to structure that addresses and resolves some problems identified herein. The logic(s) may also provide significantly more advantages to solve these problems by providing an exemplary inventive concept as specific logic structure and concordant functionality of the method and system. Furthermore, the logic(s) may also provide specific computer implemented rules that improve on existing technological processes. The logic(s) provided herein extends beyond merely gathering data, analyzing the information, and displaying the results. Further, portions or all of the present disclosure may rely on underlying equations that are derived from the specific arrangement of the equipment or components as recited herein. Thus, portions of the present disclosure as it relates to the specific arrangement of the components are not directed to abstract ideas. Furthermore, the present disclosure and the appended claims present teachings that involve more than performance of well-understood, routine, and conventional activities previously known to the industry. In some of the method or process of the present disclosure, which may incorporate some aspects of natural phenomenon, the process or method steps are additional features that are new and useful.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

While components of the present disclosure are described herein in relation to each other, it is possible for one of the components disclosed herein to include inventive subject matter, if claimed alone or used alone. In keeping with the above example, if the disclosed embodiments teach the features of components A and B, then there may be inventive subject matter in the combination of A and B, A alone, or B alone, unless otherwise stated herein.

As used herein in the specification and in the claims, the term "effecting" or a phrase or claim element beginning with the term "effecting" should be understood to mean to cause something to happen or to bring something about. For example, effecting an event to occur may be caused by actions of a first party even though a second party actually performed the event or had the event occur to the second party. Stated otherwise, effecting refers to one party giving another party the tools, objects, or resources to cause an event to occur. Thus, in this example a claim element of "effecting an event to occur" would mean that a first party is giving a second party the tools or resources needed for the second party to perform the event, however the affirmative single action is the responsibility of the first party to provide the tools or resources to cause said event to occur.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "above", "behind", "in front of", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral", "transverse", "longitudinal", and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

To the extent that the present disclosure has utilized the term "invention" in various titles or sections of this specification, this term was included as required by the formatting requirements of word document submissions pursuant the guidelines/requirements of the United States Patent and Trademark Office and shall not, in any manner, be considered a disavowal of any subject matter.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. A sample and hold amplifier buffer comprising:
   a positive input;
   a negative input;
   an output;
   at least one level shifter;
   at least one negative-positive-negative (NPN) bipolar junction transistor (BJT);
   at least one load device; and
   at least one metal oxide semiconductor field transistor (MOSFET) between a base and an emitter of the NPN BJT.

2. The sample and hold amplifier buffer of claim 1 wherein the at least one NPN BJT further comprises:
   at least one silicon germanium transistor.

3. The sample and hold amplifier buffer of claim 1 wherein the at least one MOSFET further comprises:
   at least one positive-channel MOSFET.

4. The sample and hold amplifier buffer of claim 1 wherein the at least one level shifter further comprises:
   at least one negative-channel MOSFET.

5. The sample and hold amplifier buffer of claim 1 wherein the at least one level shifter further comprises:
   at least one of a unidirectional logic level shifter and a unidirectional voltage level translator.

6. The sample and hold amplifier buffer of claim 1 wherein the at least one level shifter further comprises:
   at least one of a bidirectional logic level shifter and a bidirectional voltage level translator.

7. The sample and hold amplifier buffer of claim 1 wherein the at least one load device further comprises:
   at least one of a load impedance resistor and a feedback impedance resistor.

8. The sample and hold amplifier buffer of claim 1 further comprising:
   at least two level shifters;
   at least two NPN BJTS;
   at least two load devices; and
   at least two MOSFETs between the base and the emitter of the NPN BJTs;
   wherein the buffer is symmetrical.

9. A sample and hold amplifier buffer comprising:
   a positive input;
   a negative input;
   an output;
   at least two negative-positive-negative (NPN) bipolar junction transistors (BJTs);
   at least two load devices; and
   at least two metal oxide semiconductor field transistors (MOSFETs), each MOSFET between a base and an emitter of each NPN BJT;
   wherein the buffer is symmetrical.

10. The sample and hold amplifier buffer of claim 9 further comprising:
    at least one NPN current source for each NPN.

11. The sample and hold amplifier buffer of claim 9 wherein each NPN BJT further comprises:
    at least one silicon germanium transistor.

12. The sample and hold amplifier buffer of claim 9 wherein each MOSFET further comprises:
    at least one positive-channel MOSFET.

13. The sample and hold amplifier buffer of claim 9 wherein each load device further comprises:
    at least one of a load impedance resistor and a feedback impedance resistor.

14. The sample and hold amplifier buffer of claim 9, further comprising:
    at least two level shifters, wherein each level shifter includes:
      at least one of a unidirectional logic level shifter and a unidirectional voltage level translator; and
      at least one of a load impedance resistor and a feedback impedance resistor.

15. A sample and hold system comprising:
    at least one input;
    a first buffer circuit;
    a fast sampling switch;
    a second buffer circuit; and
    an output;
    wherein the first buffer circuit and the second buffer circuit both further comprise:
      at least one negative-positive-negative (NPN) bipolar junction transistor (BJT); and
      at least one metal oxide semiconductor field transistor (MOSFET) between a base and an emitter of the NPN BJT.

16. The sample and hold system of claim 15 wherein the at least one NPN BJT of the first buffer circuit and the at least one NPN BJT of the second buffer circuit both further comprise:
    at least one silicon germanium transistor.

17. The sample and hold system of claim 15 wherein the first buffer circuit and the second buffer circuit both further comprise:
    at least one of a load impedance resistor and a feedback impedance resistor.

18. The sample and hold system of claim 15 wherein the at least one MOSFET of the first buffer circuit and the second buffer circuit both further comprise:
    at least one positive-channel MOSFET.

19. The sample and hold system of claim 15 wherein the first buffer circuit and the second buffer circuit both further comprise:
    at least one logic level shifter.

20. The sample and hold system of claim 19 wherein the at least one logic level shifter further comprises:
    at least one negative-channel MOSFET.

* * * * *